United States Patent
Ngai

(10) Patent No.: US 9,490,811 B2
(45) Date of Patent: Nov. 8, 2016

(54) FINE GRAIN PROGRAMMABLE GATE ARCHITECTURE WITH HYBRID LOGIC/ROUTING ELEMENT AND DIRECT-DRIVE ROUTING

(71) Applicant: Tony Kai-Kit Ngai, Saratoga, CA (US)

(72) Inventor: Tony Kai-Kit Ngai, Saratoga, CA (US)

(73) Assignee: EFINIX, INC., Milpitas, CA (US)

( * ) Notice: Subject to any disclaimer, the term of this patent is extended or adjusted under 35 U.S.C. 154(b) by 0 days.

(21) Appl. No.: 14/044,732

(22) Filed: Oct. 2, 2013

(65) Prior Publication Data

US 2014/0097868 A1   Apr. 10, 2014

Related U.S. Application Data

(60) Provisional application No. 61/709,837, filed on Oct. 4, 2012.

(51) Int. Cl.
*H03K 19/177* (2006.01)
*H03K 19/0175* (2006.01)
*H03K 19/173* (2006.01)

(52) U.S. Cl.
CPC .. *H03K 19/017581* (2013.01); *H03K 19/1737* (2013.01); *H03K 19/17728* (2013.01)

(58) Field of Classification Search
CPC .......... G05B 2219/15057; G05B 2219/34024; G05B 2219/34026; G06F 17/50; G06F 17/5027; G06F 17/5054; H03K 19/1737; H03K 19/17704; H03K 19/17728; H03K 19/17732; H03K 19/17736
USPC .................................. 326/37, 38, 39, 41, 47
See application file for complete search history.

(56) References Cited

U.S. PATENT DOCUMENTS

| | | | | |
|---|---|---|---|---|
| 5,740,069 A | * | 4/1998 | Agrawal | H03K 19/1737 326/41 |
| 5,883,525 A | * | 3/1999 | Tavana | H03K 19/17704 326/39 |
| 6,069,490 A | * | 5/2000 | Ochotta | H03K 19/17728 326/39 |
| 6,275,064 B1 | * | 8/2001 | Agrawal | H03K 19/17728 326/38 |
| 6,292,018 B1 | * | 9/2001 | Kean | G06F 17/5054 326/39 |
| 6,292,022 B2 | * | 9/2001 | Young | G06F 17/5054 326/39 |
| 6,879,184 B1 | * | 4/2005 | Fisk | H03K 19/17728 326/41 |
| 7,146,583 B1 | * | 12/2006 | Sun | G06F 17/5045 716/113 |
| 7,380,035 B1 | * | 5/2008 | Donlin | H03K 19/17732 710/116 |
| 7,385,420 B1 | * | 6/2008 | Kundu | G11O 5/063 326/38 |
| 7,521,961 B1 | * | 4/2009 | Anderson | H03K 19/17736 326/41 |
| 7,831,943 B1 | * | 11/2010 | Das | G06F 17/5054 716/106 |
| 7,930,661 B1 | * | 4/2011 | Trimberger | G06F 17/5054 716/100 |
| 2004/0225980 A1 | * | 11/2004 | Cappelli | H01L 27/11803 716/117 |
| 2006/0255833 A1 | * | 11/2006 | Singh | G01R 31/31717 326/41 |
| 2008/0074142 A1 | * | 3/2008 | Henderson | H03K 19/17732 326/41 |
| 2015/0123706 A1 | * | 5/2015 | Cong | G11C 13/0002 326/41 |

* cited by examiner

*Primary Examiner* — Jason M Crawford
*Assistant Examiner* — Kurtis R Bahr
(74) *Attorney, Agent, or Firm* — Blakely, Sokoloff, Taylor & Zafman LLP

(57) ABSTRACT

An apparatus is disclosed herein for a programmable gate architecture with hybrid logic/routing circuitry. In one embodiment, a programmable gate array comprises a plurality of hybrid logic or routing tiles (HLRT), each of the HLRTs having a hybrid logic-or-routing function (HLR) that is configurable as a logic function or a routing function.

20 Claims, 7 Drawing Sheets

FINE GRAIN PROGRAMMABLE GATE ARCHITECTURE WITH HYBRID LOGIC/ROUTING ELEMENT AND DIRECT-DRIVE ROUTING

PRIORITY

The present patent application claims priority to and incorporates by reference the corresponding provisional patent application Ser. No. 61/709,837, titled, "Fine Grain Programmable Gate Architecture with Hybrid Logic/Routing Element and Direct-Drive Routing" filed on Oct. 4, 2012.

FIELD OF THE INVENTION

Embodiments of the present invention relate to the field of programmable gate architectures; more particularly, embodiments of the present invention relate to programmable gate architectures with a programmable element that allows the gate architecture to be configured as a logic function or a routing function.

BACKGROUND OF THE INVENTION

Modern FPGA fabric architecture consists of programmable segmented routing and programmable logic blocks. Segmented routing usually consists of routing wires in different lengths in vertical and horizontal directions. For example, the x1 length can reach the next tile and the x2 length can reach 2 tiles away. Shorter routing usually provides more routing flexibility and lower metal channel usage, but shorter routing can cause performance to be slower. The use of longer routing is faster for longer distance connections, but more costly in terms of die size and less flexibility in terms of connectivity. Overall, FPGA programmable routing is costly in die size, slow in performance, and more power hungry than other ASIC and ASSP solutions in the same process technology.

FIG. 1 represents a typical FPGA architecture model upon which most modern FPGAs are based. Referring to FIG. 1, the connection block ("C" Block) provides input and output multiplexing (muxing) connections from the corresponding logic block to vertical and horizontal routings. The switch block ("S" Block) provides the vertical and horizontal routing connections to stitch routing segments together. Routing resources have various segmentation lengths to provide different tradeoffs between routing density, connection flexibility, performance, etc.

Generally, since an FPGA has the same routing density across the entire array, routing count per row or column is set by the worst-case routing congestion. This is quite wasteful given that most locations would require routing density much lower than the worst-case locations.

Another challenge with modern FPGAs is that the advanced process technology node has very resistive metal interconnects even though the transistors contained therein are getting faster. This affects the overall FPGA performance significantly, given that routing delay limits FPGA performance and resistive metal interconnect slows down longer routing significantly. In order to compensate of this effect, modern FPGAs use wider metal wires to lower resistance for performance, which in turn consumes even more area and power.

SUMMARY OF THE INVENTION

An apparatus is disclosed herein for a programmable gate architecture with hybrid logic/routing circuitry. In one embodiment, a programmable gate array comprises a plurality of hybrid logic or routing tiles (HLRT), each of the HLRTs having a hybrid logic-or-routing function (HLR) that is configurable as a logic function or a routing function.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

Figure 1:
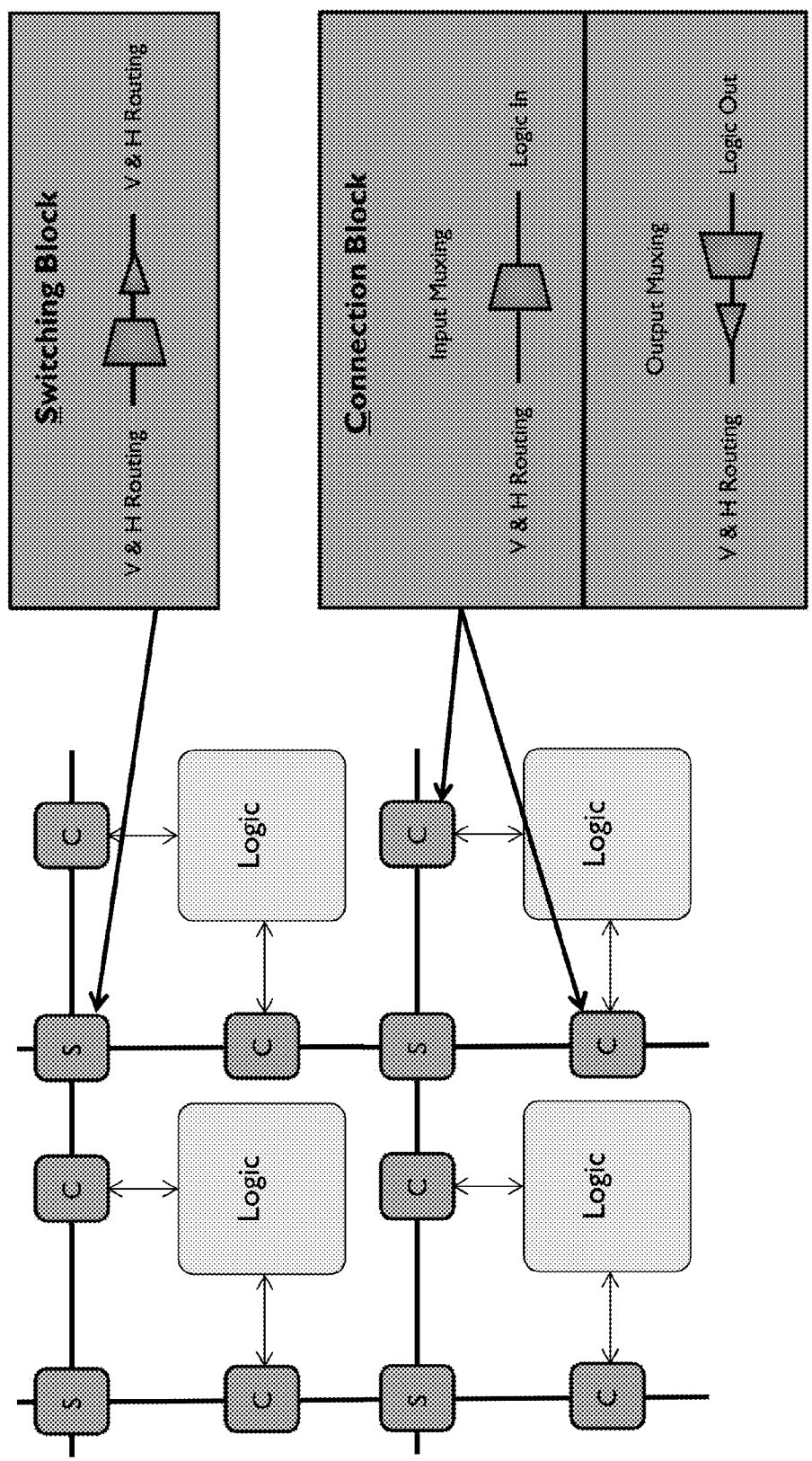
FIG. 1 illustrates a typical FPGA architecture model upon which most modern FPGAs are based.

Embodiments of this invention include a programmable gate architecture that includes a fine-grain logic-or-routing programmable element with a direct-drive routing architecture. In one embodiment, a direct-drive routing architecture is a routing architecture where each routing resource can only be driven by one source, different from existing FPGA routing architectures where each routing resource can be driven by tens of sources with a large input multiplexing. In one embodiment, the programmable element utilizes direct-drive routing channels to connect blocks together directly, without hopping through routing segmentation in a typical segmented routing architecture as is used in most FPGA architectures. If one direct routing cannot reach from the source block to destination block, another block(s) can be configured to operate as a routing function to extend the reach to complete the connection.

Embodiments of this invention provide a significant speed advantage against the segmented routing architecture of the prior art because of the use of direct-drive routing. The direct-drive routing also cheaper (less die size) and more power efficient than the traditional FPGAs because the routing resources can be dynamically expanded to handle the worst case routing congestion without wasting extra routing resources everywhere else.

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; etc.

Overview

A programmable gate architecture having multiple hybrid logic or routing tiles (HLRT) is disclosed. In one embodiment, the plurality of HLRTs forms an array of columns and rows. In one embodiment, each of the HLRTs is configurable as a logic function or a routing function. In one embodiment, one or more of the HLRTs are configured as a routing function and serve as a routing hub. In one embodiment, where an HLRT is configured as a logic function, the logic function is implemented using a look-up table structure programmed as a multiplexer.

In one embodiment, neighboring HLRTs are directly connected via direct-drive routing. That is, HLRTs are connected together without routing segmentation. In one embodiment, to connect an HLRT configured as a logic function with an external port, multiple HLRTs that are configured as routing functions may be used, such that the external port is directly connected to the HLRT configured as the logic function and signals can be transferred through the direct connection formed by the multiple HLRTs configured as routing functions.

In one embodiment, HLRTs in the plurality of HLRTs include a connection block to provide input multiplexing to an HLRT. In one embodiment, the connection block provides input multiplexing without providing output multiplexing to routing resources.

In one embodiment, the HLRTs comprise a stand-alone die. In another embodiment, the HLRTs form an array that is an embedded IP core in an integrated circuit. In yet another embodiment, the HLRTs form an array that is part of a stacked die arrangement.

Figure 2:
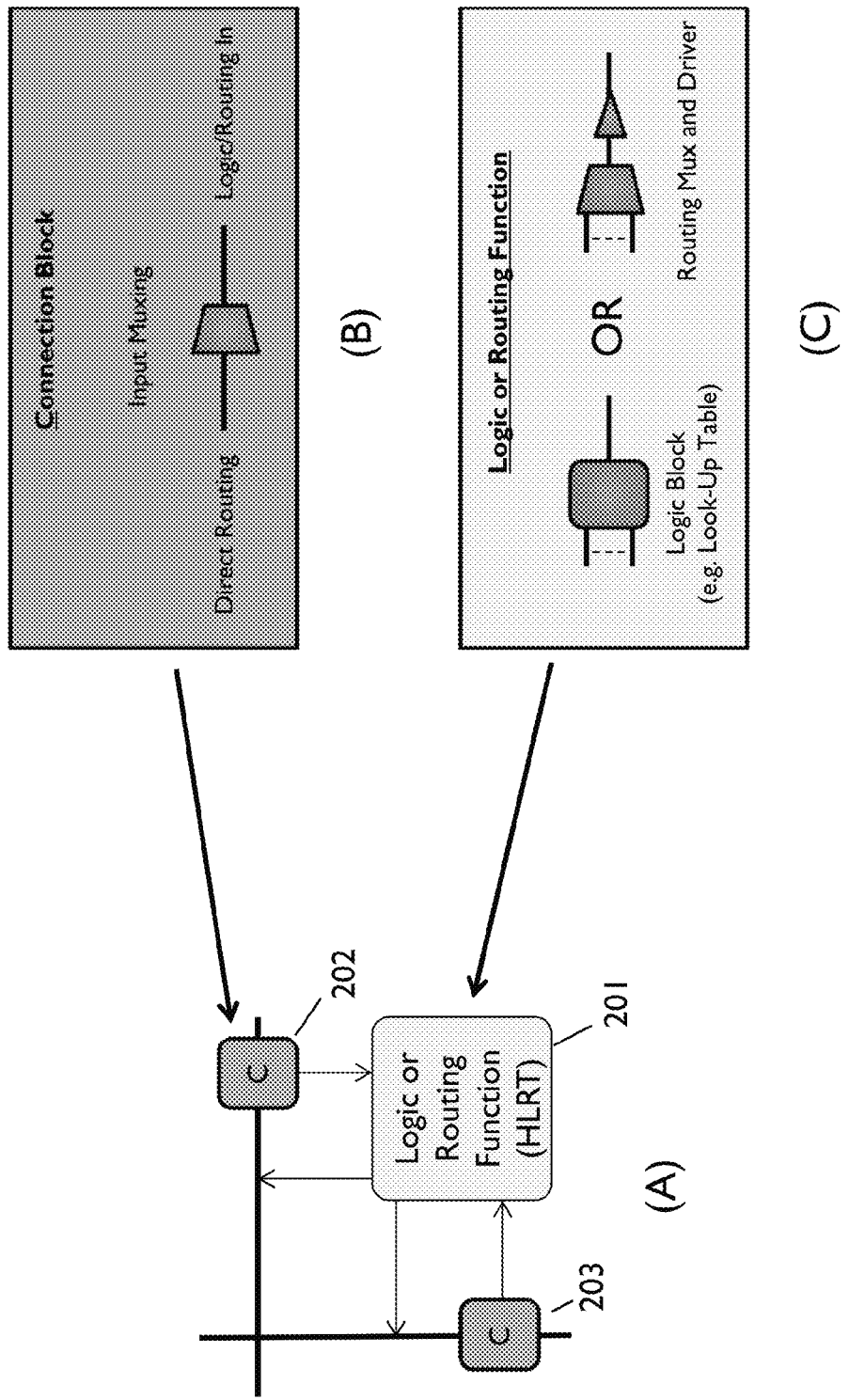
FIGS. 2A-C illustrate one embodiment of a programmable logic architecture in which each new logic tile (HLRT) can be configured as a logic function or a routing function to enable the hybrid logic-or-routing function (HLR) to serve as a routing hop.

FIG. 2A illustrates one embodiment of a programmable logic architecture in which each new hybrid logic-or-Routing function (HLR) can also serve as a routing hop or a logic function. That is, the HLR is configurable as a logic function or a routing function. Referring to FIG. 2, a programmable logic architecture 200 (HLRT) with a hybrid logic-or-routing function (HLR) 201 and connection blocks 202 and 203. HLR 201 is configurable as either a logic function or a routing function. FIG. 2C illustrates an HLR with selectable logic mode (e.g., n-input look-up table) to support any n-inputs logic functions or the same logic block can be configured as routing mux and driver configurations to support routing expansion by programming the look-up table content accordingly.

For example, in one configuration, logic block in HLR 201 is implemented using a look-up table structure for any logic function that has n inputs. The same look-up table structure can be programmed as a static n-to-1 multiplexer (mux) such that HLR 201 can serve as a routing hop to jump between routing segments, similar to the function of a switching block as in the typical modern FPGA architecture in FIG. 1.

In one embodiment, all routing resources are direct connections between two HLRTs such that no switching block is needed in this architecture (as is shown in the prior art of FIG. 1).

Connection blocks 202 and 203 only provide input multiplexing (muxing) to HLRs without output muxing to routing resources as occurs in a typical segmented routing architecture of the prior art. FIG. 2B illustrates the input muxing with a direct routing input and an output being sent to a logic function or a routing function provided by the HLR. Although FIG. 2B only shows one mux, there may be more than one input mux in each connection block. Note that while two connection blocks are shown in FIG. 2A, a programmable gate architecture may have more or less than two connection blocks interfacing the HLR to the routing traces.

Embodiments of the programmable gate architecture described herein offer a number of benefits. Embodiments of the programmable gate architecture provide ultra fast logic-to-logic connection such that it is much faster to implement critical paths than typical segmented FPGA. Since there is no fixed logic and routing resource allocation and such can be reassigned dynamically, embodiments of the programmable gate architecture don't require extra routing resources allocated everywhere for the worst-case designs. As the result, it has high logic density per area and it is cheaper in die size than traditional segmented architecture.

Figure 3A:
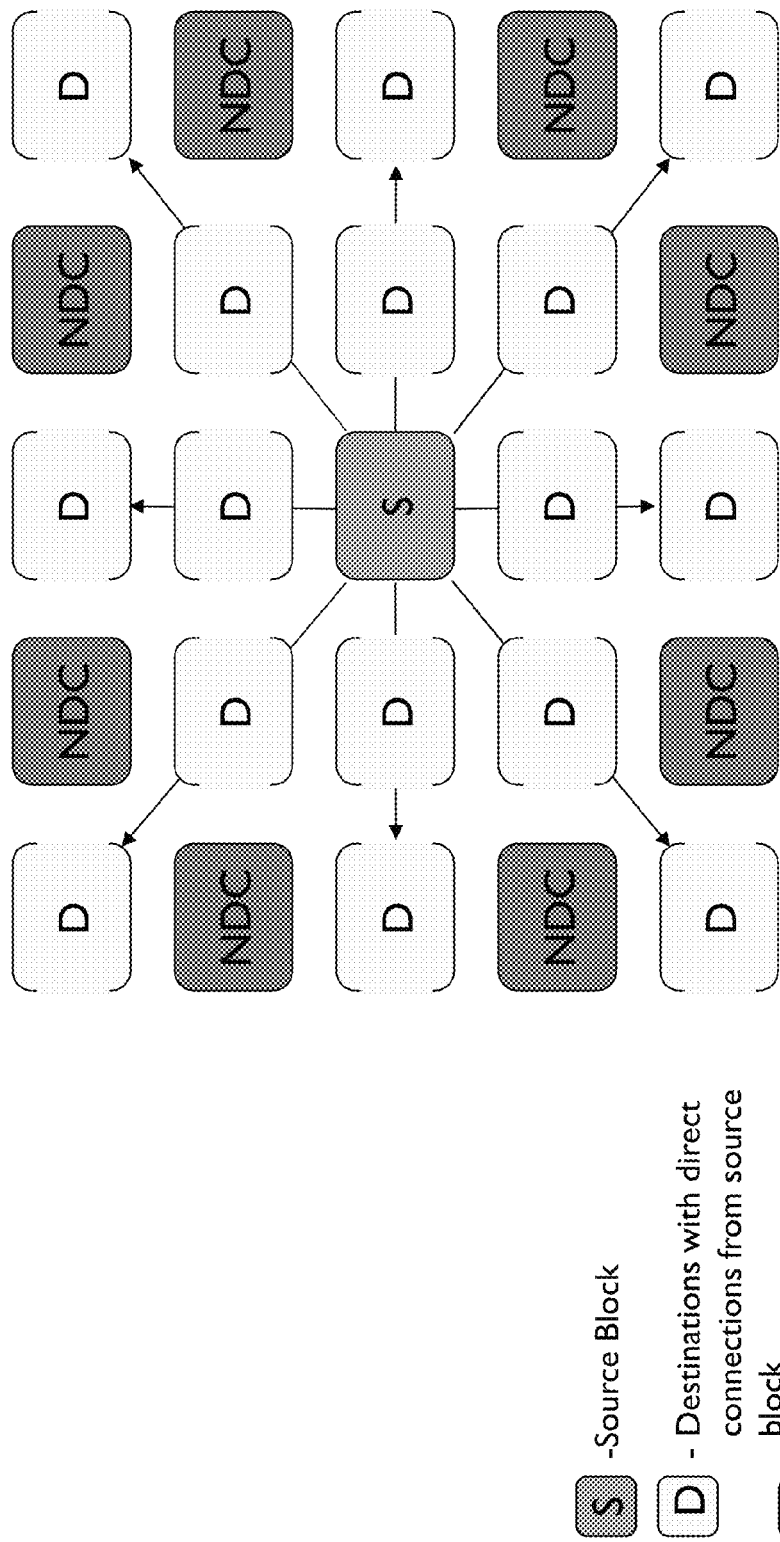
FIG. 3A illustrates example of direct routing with respect to HLRTs.

FIG. 3A shows a direct routing example where a HLRT output can reach a number of surrounding HLRT inputs directly. Referring to FIG. 3A, a source block representing one programmable gate architecture with an HLRT can reach 16 surrounding HLRT inputs directly. The 16 HLRTs are shown with the letter "D", representing destinations with direct connections from the source block. This direct routing approach can be extended to cover different numbers of surrounding HLRT neighbors. Also shown are blocks, labeled "NDC", that have no direct connection from the source block.

Figure 3B:
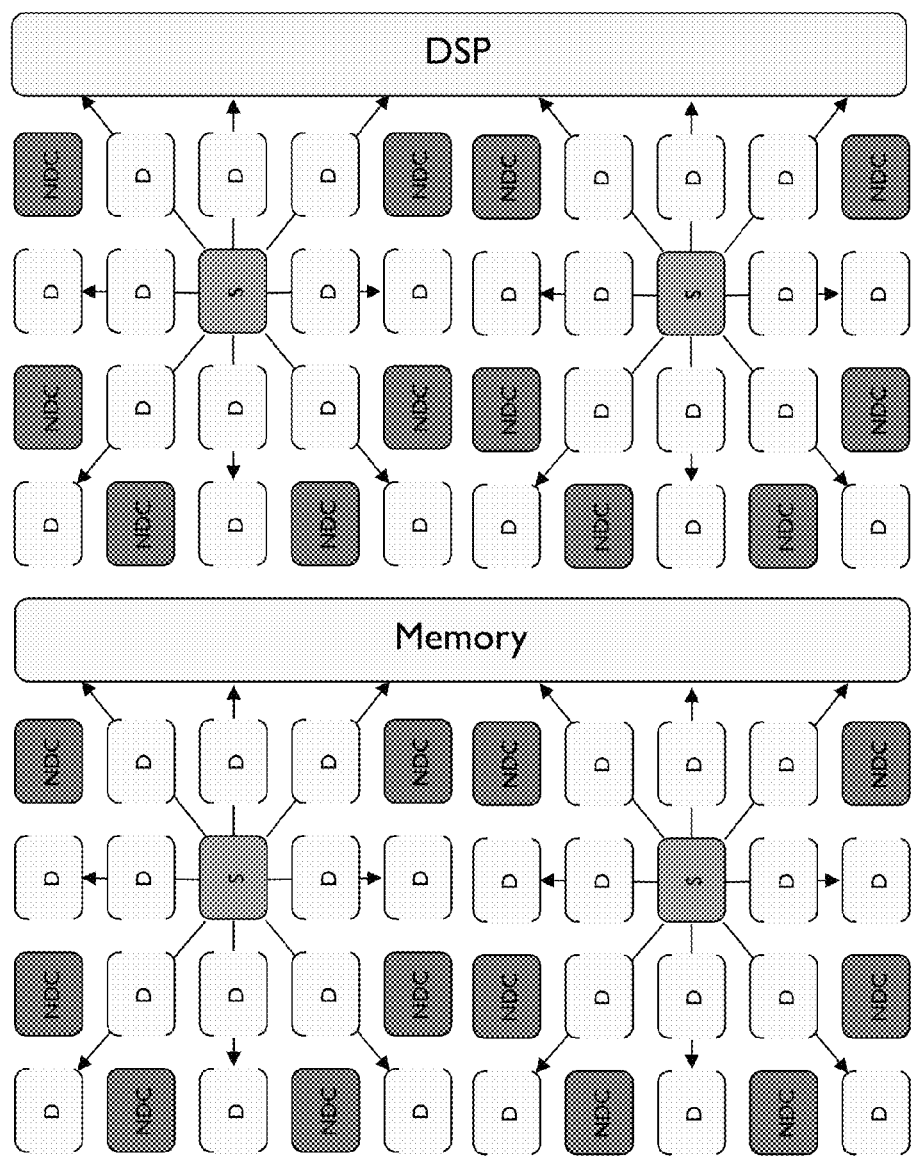
FIG. 3B illustrates an HLRT array with different types of logic elements.

In one embodiment, the HLRT array may contain different types of logic elements and can support other functions as well, including memory, DSP and other embedded IP elements, as shown in FIG. 3B.

Figure 4:
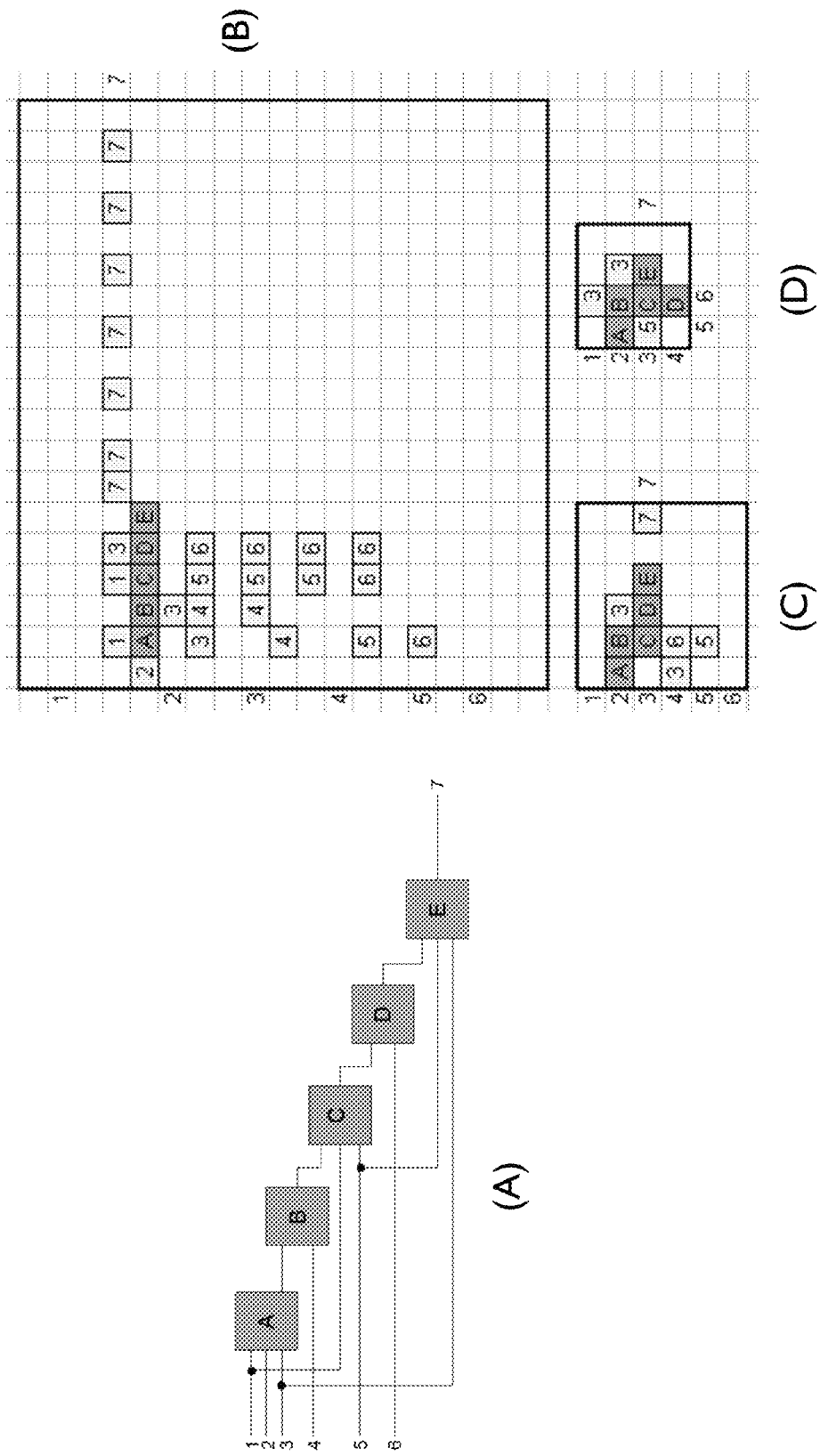
FIGS. 4A-D illustrates a place-and-route example of one design in three different HLRT arrays.

FIGS. 4A-D shows a post place-and-route example whether a sample design with 5 logic blocks (labeled "A" to "E") are connected to 7 external ports (1-7). Referring to FIG. 4A, a circuit design is shown with inputs 1-6 and the 5 logic blocks A-E producing an output 7. When this design is placed into an HLRT array, such as shown in either of FIGS. 4B-D, 5 tiles are used in logic mode for block A to E and the connections between these tiles are direct connections as shown in FIG. 3. These 5 logic tiles are labeled as "A", "B', "C", "D" and "E" in the 3 arrays of FIGS. 4B-D. These 3 HLRT arrays are 4×4 (FIG. 4D), 6×6 (FIG. 4C) and 19×19 (FIG. 4B) in size.

Assuming all ports are at the outside boundary of the arrays shown in FIGS. 4B-D, the 7 external ports (port 1 to 7) may connect to block A to E directly through the direct-routing pattern as in FIG. 3 or they will need to hop through other HLRTs used as routing function blocks. They are labeled as "1" to "7" squares in the 3 HLRT arrays in FIGS. 4B-D. For example, as in the 19×19 array of FIG. 4B, the net to connect block "E" (the output of the circuit design of FIG. 4A) to port "7" goes through seven HLRT tiles. Thus, those 7 tiles are configured as routing functions and there is an initial hop from logic block E to the closest tile (square) with a "7". Similarly, the input 1 that goes to logic block A and block C of the circuit design in FIG. 4A would be implemented by a hop from the external port 1 to the nearest tile labeled with a 1 and then from that HLRT labeled 1 one a direct connection to logic block A and another hop to the other HLRT labeled 1 from which a direct connection to logic block C is made. Similar connections are made in FIG. 4B from the external ports 2-6 through other HLRTs to the logic blocks to implement the circuit design in FIG. 4A.

The implementation of the connections in the arrays of FIGS. 4C and 4D are made in a similar way to those in FIG. 4B, except there are some direct connections between external ports and HLRTs implementing logic blocks in FIGS. 4C and 4D. For example, in FIG. 4C, external port 1 is directly connected to logic blocks A and C, external port 2 is directly connected to logic block A, and external port 4 is directly connected to logic block B. In FIG. 4C, external port 3 connects to logic block A directly to logic block E using two hops.

Figure 6:
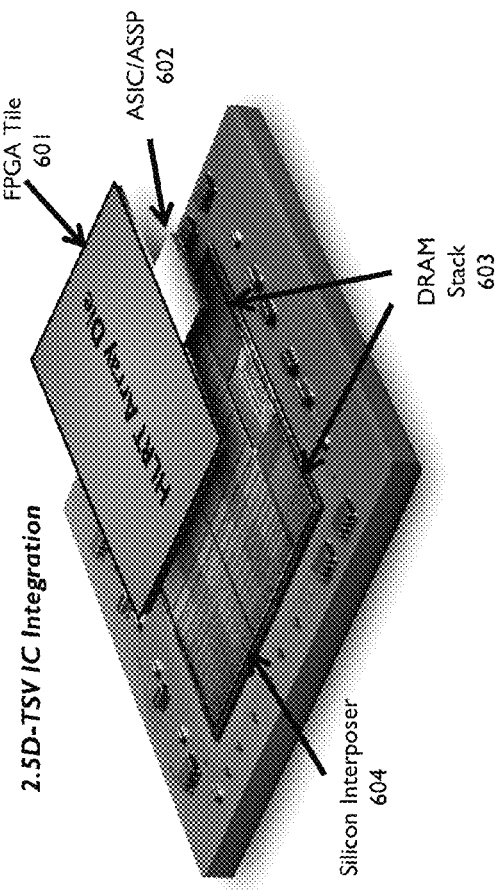
FIG. 6 illustrates another example integrated circuit integration of an HLRT array onto a 2.5D silicon interposer arrangement.
Figure 5:
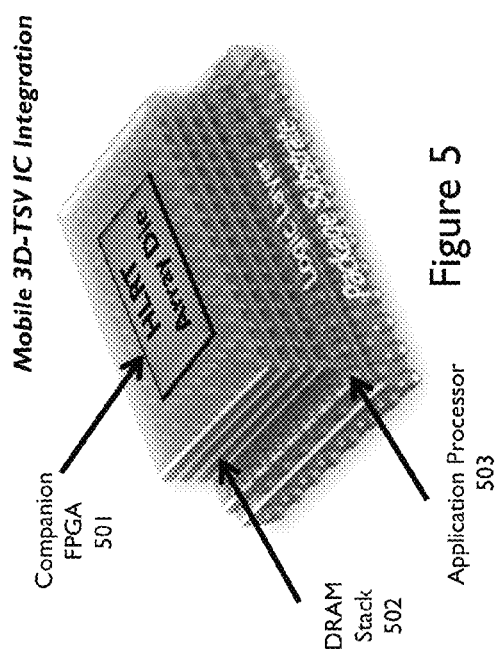
FIG. 5 illustrates an example integrated circuit integration of an HLRT array in a stacked dies arrangement.
Figure 7:
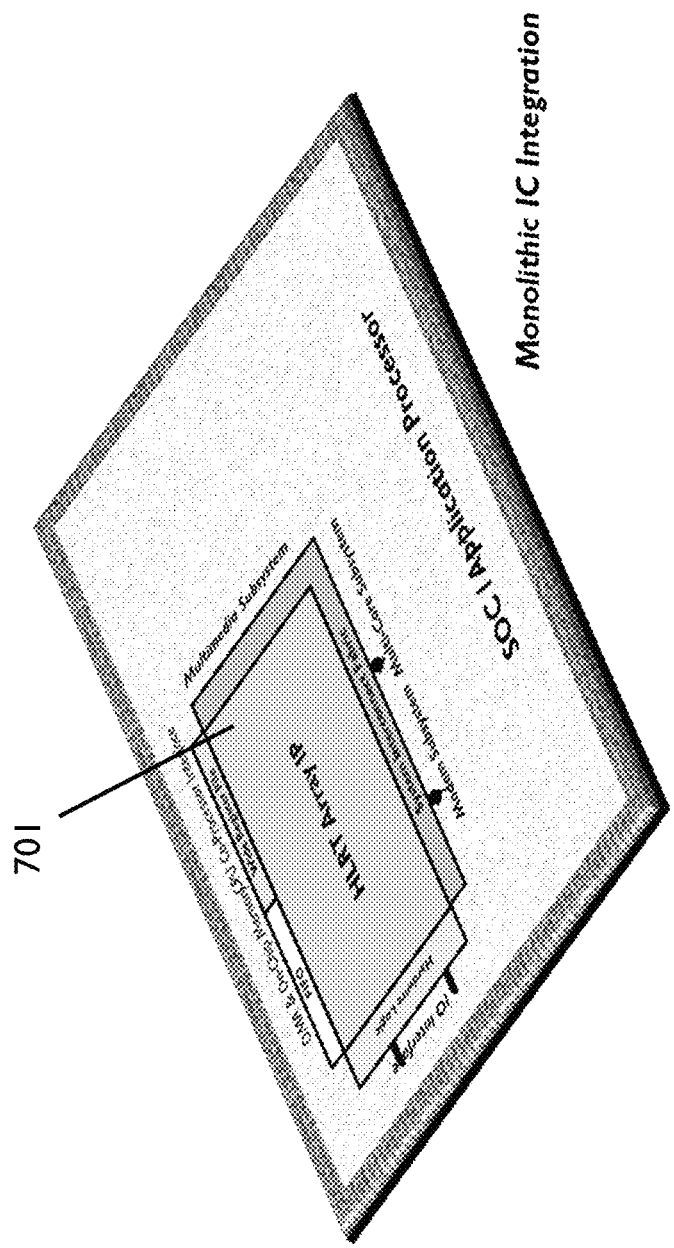
FIG. 7 illustrates an example monolithic integrated circuit integration of an HLRT array as part of a processor in monolithic IC integration.

FIGS. 5-7 illustrate example integrated circuit (IC) integrations with HLRT arrays. More specifically, FIG. 5 illustrates an example integrated circuit integration of an HLRT array in a stacked dies arrangement. Referring to FIG. 5, FPGA 501 comprising an HLRT array (of HLRTs) is stacked on DRAM stack 502, which is stacked on top of application processor 503. Application processor 503 is attached to a package substrate as in a typical 3D integration.

FIG. 6 illustrates another example integrated circuit integration of an HLRT array onto a silicon interposer on top of package substrate. Referring to FIG. 6, an FPGA tile 601 consisting of an HLRT array die is stacked on top a silicon interposer 604 with an ASIC/ASSP 602 and two DRAM stacks 603 stacked on interposer 640. In one embodiment, connections between these components include through silicon vias (TSVs). Silicon interposer 604 is connected to a package substrate as in a typical 2.5D integration.

FIG. 7 illustrates an example monolithic integrated circuit integration of an HLRT array are part of a processor. Referring to FIG. 7, an HLRT array IP 701 consisting of multiple HLRTs is shown integrated into a monolithic IC. In one embodiment, the monolithic IC comprises an system-on-a-chip (SOC) and/or application processor.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

I claim:

1. A field programmable gate array (FPGA) comprising:
a plurality of tiles, each tile of the plurality of tiles operable to be programmed at different times to perform only a logic function or only a routing function, wherein the plurality of tiles comprise a first tile comprising a first look-up table that is programmed to perform the logic function; and a set of second tiles that are separated from the first tile by one or more third tiles, wherein an output of the first tile is directly connected to at least one of the second tiles via at least one of the third tiles that comprises the look-up table that is programmed as a routing multiplexer coupled to a driver to perform the routing function.

2. The FPGA defined in claim 1 wherein the third tiles comprise at least eight neighboring tiles having the look up table that is programmed as the routing multiplexer coupled to the driver that are directly connected to the first tile.

3. The FPGA defined in claim 2 wherein the first tile and the set of second tiles are connected together without routing segmentation.

4. The FPGA defined in claim 1 wherein the at least the third tiles serves as a routing hub.

5. The FPGA defined in claim 1 wherein an output of the routing multiplexer is coupled to an input of the driver to perform the routing function.

6. The FPGA defined in claim 1, further comprising a connection block to provide input multiplexing to at least one of the tiles.

7. The FPGA defined in claim 6 wherein the connection block only provides the input multiplexing without providing output multiplexing to routing resources.

8. The FPGA defined in claim 1 further comprising an external port coupled to the at least one of the third tiles to transfer signals, and wherein the external port is directly connected to the first tile via the at least one of the third tiles.

9. The FPGA defined in claim 1 wherein the plurality of tiles are same tiles arranged in an array of columns and rows.

10. The FPGA defined in claim 1 wherein the plurality of tiles is a stand-alone die.

11. The FPGA defined in claim 1 wherein the plurality of tiles forms an array that is an embedded core in an integrated circuit.

12. The FPGA defined in claim 1 wherein the plurality of tiles forms an array that is part of a stacked die arrangement.

13. A field programmable gate array (FPGA) comprising:
an external port to transfer signals;
a plurality of tiles forming an array of rows and columns coupled to the external port, each of the tiles being operable to be programmed at different times to perform only a logic function or a only routing function, wherein the plurality of tiles comprise a first tile comprising a first look-up table that is programmed to perform the logic function and a set of second tiles that are separated from the first tile by one or more third tiles, wherein an output of the first tile is directly connected to at least one of the second tiles via at least one of the third tiles that comprises the look-up table that is programmed as a routing multiplexer coupled to a driver to perform the routing function, and wherein the external port is directly connected to the first tile through the at least one of the third tiles.

14. The FPGA defined in claim 13 wherein the first tile and the set of second tiles are connected together without routing segmentation.

15. The FPGA defined in claim 13 wherein the at least the third tiles serves as a routing hub.

16. The FPGA defined in claim 15 wherein an output of the routing multiplexer is coupled to an input of the driver to perform the routing function.

17. The FPGA defined in claim 13, further comprising a connection block to provide input multiplexing to at least one of the tiles without providing output multiplexing to routing resources.

18. The FPGA defined in claim 13 wherein the plurality of tiles is a stand-alone die.

19. The FPGA defined in claim 13 wherein the plurality of tiles forms an array that is an embedded core in an integrated circuit.

20. The FPGA defined in claim 13 wherein the plurality of tiles forms an array that is part of a stacked die arrangement.

* * * * *